(12) United States Patent
Mitsuyasu et al.

(10) Patent No.: US 11,899,360 B2
(45) Date of Patent: Feb. 13, 2024

(54) IMPRINTING METHOD AND IMPRINTING APPARATUS

(71) Applicant: KIOXIA CORPORATION, Tokyo (JP)

(72) Inventors: Masaki Mitsuyasu, Kamakura Kanagawa (JP); Kazuya Fukuhara, Suginami Tokyo (JP)

(73) Assignee: Kioxia Corporation, Tokyo (JP)

(*) Notice: Subject to any disclaimer, the term of this patent is extended or adjusted under 35 U.S.C. 154(b) by 142 days.

(21) Appl. No.: 16/807,606

(22) Filed: Mar. 3, 2020

(65) Prior Publication Data

US 2021/0072638 A1    Mar. 11, 2021

(30) Foreign Application Priority Data

Sep. 6, 2019 (JP) .................. 2019-163362

(51) Int. Cl.
*G03F 7/00*    (2006.01)
*H01L 21/027*  (2006.01)

(52) U.S. Cl.
CPC ........ *G03F 7/0002* (2013.01); *H01L 21/0271* (2013.01)

(58) Field of Classification Search
CPC ..... G03F 7/0002; G03F 7/00; H01L 21/0271; H01L 2223/54426; H01L 23/544; H01L 2223/54433
See application file for complete search history.

(56) References Cited

U.S. PATENT DOCUMENTS

| | | | |
|---|---|---|---|
| 6,972,844 B2 | 12/2005 | Tokita | |
| 2015/0325526 A1* | 11/2015 | Hayashi | ............... G03F 7/70608 |
| | | | 264/40.5 |
| 2016/0136872 A1 | 5/2016 | Yanagisawa | |
| 2016/0207248 A1* | 7/2016 | Sato | ....................... G03F 7/0002 |

FOREIGN PATENT DOCUMENTS

| | | | |
|---|---|---|---|
| JP | 2005-108975 A | 4/2005 | |
| JP | 2007-281072 A | 10/2007 | |
| WO | WO-2013136730 A1 * | 9/2013 | ........... B29C 59/002 |

* cited by examiner

*Primary Examiner* — S. Behrooz Ghorishi
*Assistant Examiner* — John W Hatch
(74) *Attorney, Agent, or Firm* — Kim & Stewart LLP

(57) ABSTRACT

An imprinting method includes placing a template onto non-solidified resin that is applied onto a surface of a substrate, such that the non-solidified resin extends into a pattern of the template in a surface direction of the substrate, starting first alignment operation to align the template with the substrate using a first alignment mark at a first timing, and starting a second alignment operation to align the template with the substrate using a second alignment mark at a second timing after the first timing. The first timing is when the non-solidified resin has extended into the first alignment mark and not yet into the second alignment mark. The second timing is when the non-solidified resin has extended into the first and second alignment marks.

6 Claims, 9 Drawing Sheets

IMPRINTING METHOD AND IMPRINTING APPARATUS

CROSS-REFERENCE TO RELATED APPLICATION(S)

This application is based upon and claims the benefit of priority from Japanese Patent Application No. 2019-163362, filed on Sep. 6, 2019, the entire contents of which are incorporated herein by reference.

FIELD

Embodiments described herein relate generally to an imprinting method, a semiconductor device manufacturing method, and an imprinting apparatus.

BACKGROUND

There is an imprinting method as a method of forming a fine pattern in a semiconductor device manufacturing step. In the imprinting method, an alignment process between an original such as a template and a substrate is performed. The alignment process is performed by using, for example, an alignment mark provided on each of the original and the substrate. The alignment process between the original and the substrate is performed, for example, by waiting for a resin film disposed on the substrate to fill the alignment mark of the original. For that reason, time may be required for the alignment process.

DETAILED DESCRIPTION

Figure 1:
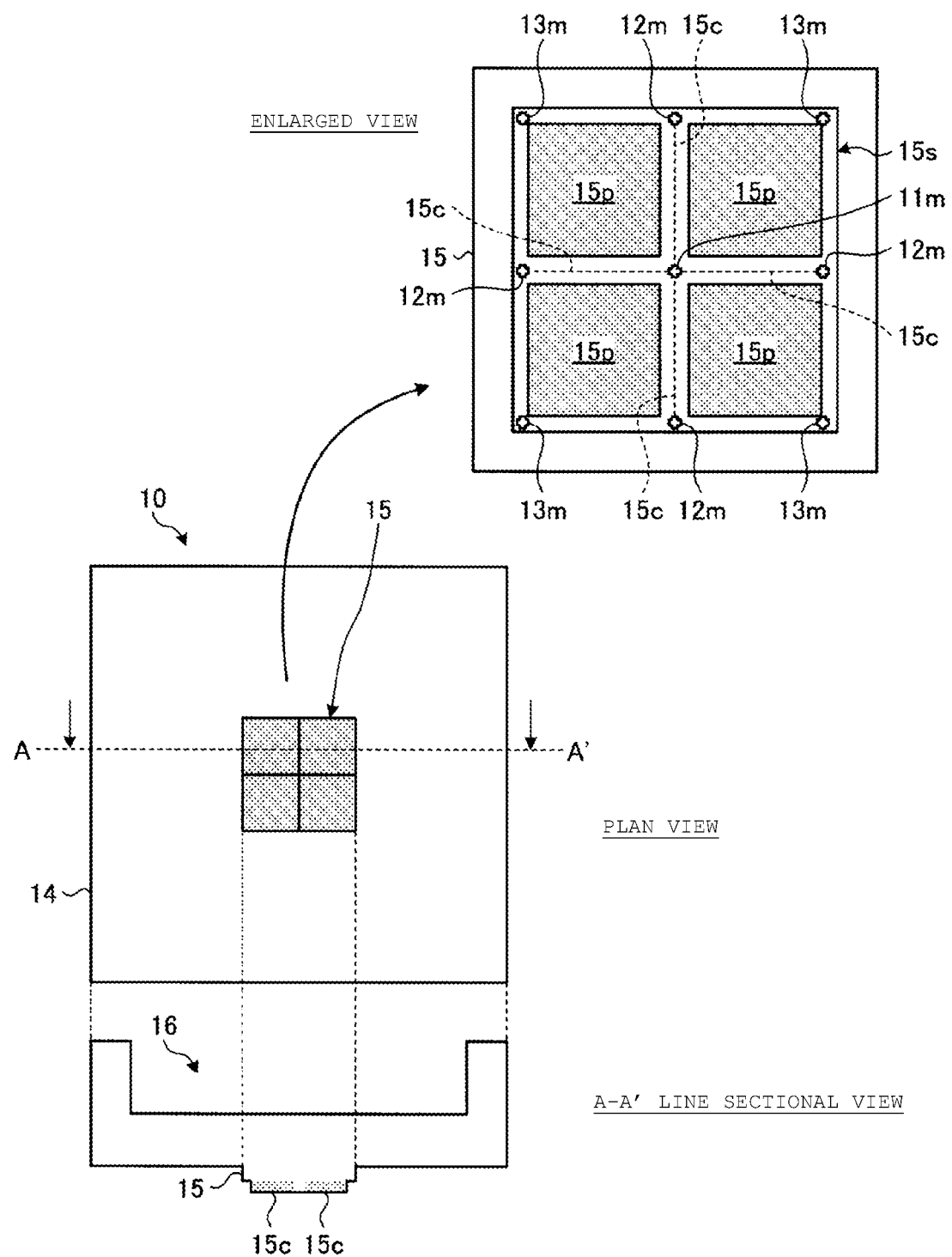
FIG. 1 is a schematic diagram illustrating an example of a configuration of a template according to Embodiment 1.

Embodiments provide an imprinting method, a semiconductor device manufacturing method, and an imprinting apparatus capable of improving a throughput of an alignment process.

In general, according to an embodiment, an imprinting method includes placing a template onto non-solidified resin that is applied onto a surface of a substrate, such that the non-solidified resin extends into a pattern of the template in a surface direction of the substrate, starting first alignment operation to align the template with the substrate using a first alignment mark at a first timing, and starting a second alignment operation to align the template with the substrate using a second alignment mark at a second timing after the first timing. The first timing is when the non-solidified resin has extended into the first alignment mark and not yet into the second alignment mark. The second timing is when the non-solidified resin has extended into the first and second alignment marks.

According to an embodiment, an imprinting apparatus includes a template stage configured to hold a template, a substrate stage configured to hold a substrate, a stage base to which the template stage is fixed, a liquid dispenser, a first imaging element positioned to detect a first alignment mark included in the template and generate a first detection signal of the first alignment mark, a second imaging element positioned to detect a second alignment mark included in the template and generate a second detection signal of the second alignment mark, and a controller. The controller is configured to control the liquid dispenser to apply non-solidified resin onto a surface of the substrate held by the substrate stage, and control the stage base to move toward the substrate stage, such that the template held by the template stage is placed onto the non-solidified resin applied onto the surface of a substrate, such that the non-solidified resin extends into a pattern of the template in a surface direction of the substrate, the template including a first alignment mark and a second alignment mark and the substrate including a third alignment mark and a fourth alignment mark. The controller is configured to detect a first timing when the non-solidified resin has extended into the first alignment mark and not yet into the second alignment mark, based on a peak of the first detection signal having reached a brightness threshold and a bottom of the first detection signal having reached a darkness threshold, and a peak of the second detection signal having not reached the brightness threshold or a bottom of the second detection signal having not reached the darkness threshold, and upon detection of the first timing, start a first alignment operation to align the template with the substrate such that the first and third alignment marks fall within a first predetermined deviation. The controller is configured to detect a second timing when the non-solidified resin has extended into the first and second alignment marks, based on the peak of the first detection signal having reached the brightness threshold and the bottom of the first detection signal having reached the darkness threshold, and the peak of the second detection signal having reached the brightness threshold and the bottom of the second detection signal having reached the darkness threshold, the second timing being after the first timing, and upon detection of the second timing, terminate the first alignment operation and start a second alignment operation to align the template with the substrate such that the second and fourth alignment marks fall within a second predetermined deviation.

According to an embodiment, the imprinting apparatus further includes a third imaging element positioned to detect a fifth alignment mark included in the template and generate a third detection signal of the fifth alignment mark. The controller is further configured to detect a third timing when the non-solidified resin has extended into the first, second, and third alignment marks, based on the peak of the first detection signal having reached the brightness threshold and the bottom of the first detection signal having reached the darkness threshold, the peak of the second detection signal having reached the brightness threshold and the bottom of the second detection signal having reached the darkness threshold, and a peak of the third detection signal having reached the brightness threshold and a bottom of the third detection signal having reached the darkness threshold, the third timing being after the second timing, and upon detecting the third timing, terminate the second alignment operation and start a third alignment operation to align the template with the substrate such that the fifth and sixth alignment marks are within a third predetermined deviation.

According to an embodiment, the controller is configured to continue the second alignment operation until the second and fourth alignment marks fall within the second predetermined deviation.

According to an embodiment, the controller is configured to continue the third alignment operation until the fifth and sixth alignment marks fall within a third predetermined deviation.

According to an embodiment, a distance between the first alignment mark and the second alignment mark is equal to a distance between the first alignment mark and the third alignment mark.

Hereinafter, the present disclosure will be described in detail with reference to the drawings. The present disclosure is not limited to the following embodiment. An element in the following embodiment includes an element that is easily conceived of by a person skilled in the art or the substantially same element.

Embodiment 1

Hereinafter, with reference to the drawings, Embodiment 1 will be described in detail.

Configuration Examples of Template and Wafer

In an imprinting process, a template provided with a fine pattern is pressed against a resist on a wafer, to transfer the fine pattern of the template onto the resist. In this case, the wafer and the template are aligned with each other by using alignment marks provided on the wafer and the template.

Hereinafter, with reference to FIGS. 1 and 2, a description will be made of configuration examples of a template 10 and a wafer 20 of Embodiment 1.

FIG. 1 is a schematic diagram illustrating an example of a configuration of the template 10 according to Embodiment 1. The template 10 of Embodiment 1 is made of a transparent member such as crystal or glass.

As illustrated in FIG. 1, the template 10 as an original is provided with, for example, a rectangular template substrate 14. A mesa portion 15 is provided on a front surface of the template substrate 14, and a recess 16 is provided on a rear surface thereof.

The mesa portion 15 is disposed at the center of the template substrate 14, and has, for example, a rectangular shape. The mesa portion 15 has a shot region 15s. The shot region 15s is a region patterned in a resist 22 on the wafer 20 through imprinting (that is, stamping of the template 10) performed once. The shot region 15s has a plurality of pattern regions 15c in which, for example, fine patterns 15p with nano-order sizes are respectively formed. The fine pattern 15p may be a pattern in which a plurality of grooves are disposed, a pattern in which a plurality of dots are disposed, or other patterns.

A plurality of alignment marks 11m to 13m are disposed in the shot region 15s. The alignment marks 11m to 13m are formed of uneven portions provided on the front surface of the template 10. The alignment marks 11m to 13m are disposed, for example, outside the fine patterns 15p at four corners of the shot region 15s. The alignment marks 11m to 13m are disposed, for example, in a cross shape between the pattern regions 15c.

More specifically, the alignment mark 11m is disposed around the center of the shot region 15s. The alignment mark 12m is disposed at the center of each side of the shot region 15s. The alignment mark 13m is disposed around each corner of the shot region 15s. The plurality of alignment marks 12m are disposed at the same distance from a central point of the shot region 15s. The plurality of alignment marks 13m are disposed at the same distance from the central point of the shot region 15s.

In other words, the plurality of alignment marks 12m are disposed at positions separated from the center of the shot region 15s more than the alignment mark 11m, that is, at the outside. The plurality of alignment marks 13m are disposed at positions separated from the center of the shot region 15s more than the alignment marks 12m, that is, at the outside.

The configuration of the template 10 illustrated in FIG. 1 is only an example, and is not limited thereto. For example, in the example illustrated in FIG. 1, the four pattern regions 15c, the single alignment mark 11m, the four alignment marks 12m, and the four alignment marks 13m are disposed in the single shot region 15s, but the number and disposition of such configurations are not limited thereto.

Figure 2:
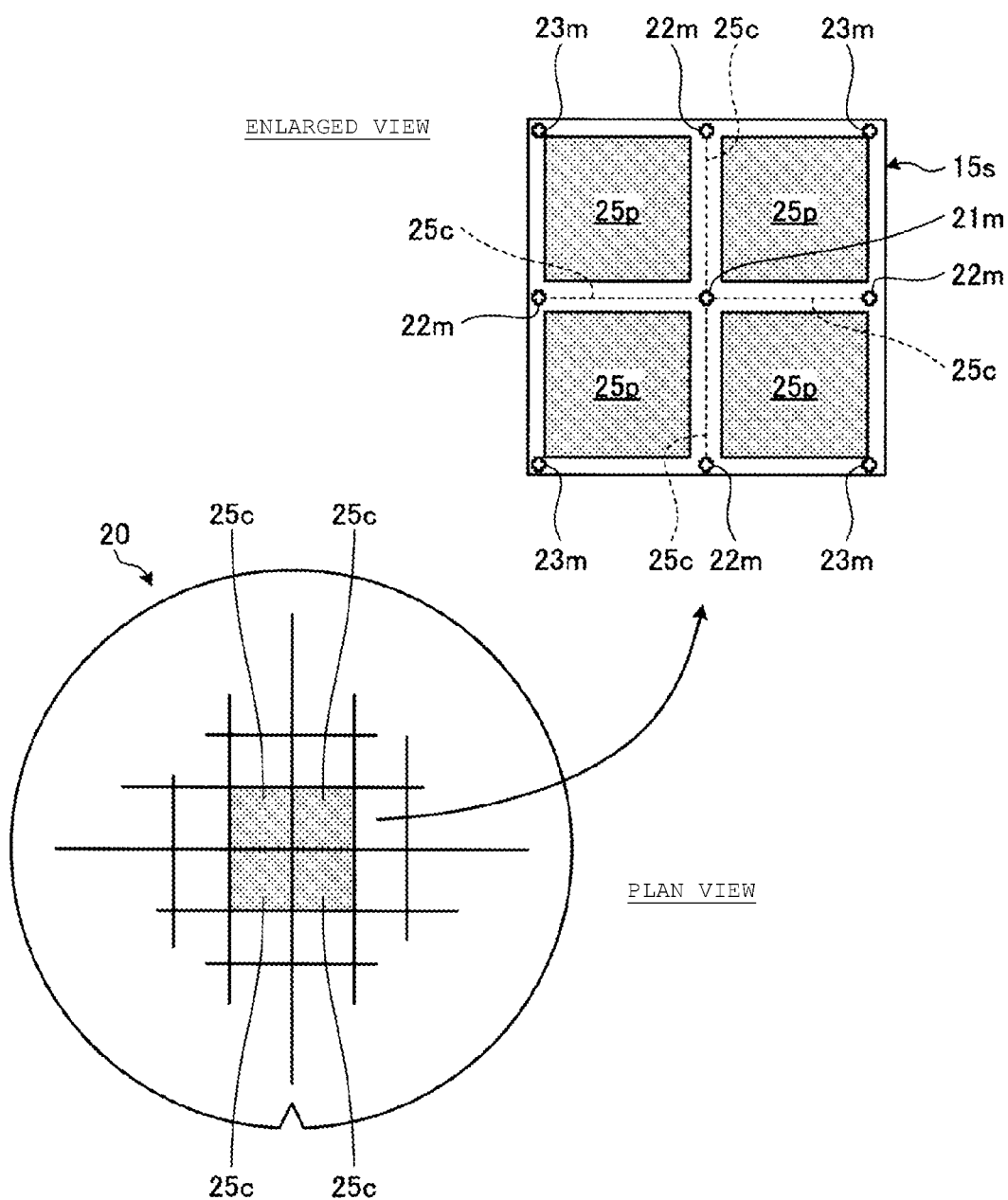
FIG. 2 is a schematic diagram illustrating an example of a configuration of a wafer according to Embodiment 1.

FIG. 2 is a schematic diagram illustrating an example of a configuration of the wafer 20 according to Embodiment 1.

As illustrated in FIG. 2, the wafer 20 has, for example, a plurality of chip regions 25c on the entire surface of the wafer 20. The chip regions 25c are regions that are cut into chips in a final stage of a semiconductor device manufacturing step. The chip region 25c has an element portion 25p, and a plurality of alignment marks 21m to 23m are provided outside the element portion 25p. The alignment marks 21m to 23m are formed of uneven portions provided on any one of films including a treatment film 21 on the wafer 20.

The plurality of alignment marks 21m to 23m are disposed at positions respectively corresponding to the alignment marks 11m to 13m of the template 10. In other words, when the wafer 20 and the template 10 are aligned with each other, for example, alignment is performed such that the alignment mark 21m overlaps the alignment mark 11m, the alignment marks 22m overlap the alignment marks 12m, and the alignment marks 23m overlap the alignment marks 13m.

As mentioned above, in the aligned state, for example, four chip regions 25c are disposed at positions in a single shot region 15s of the template 10. In other words, the single chip region 25c is the substantially same region as the single pattern region 15c. In the element portion 25p, a pattern is transferred onto the resist 22 through an imprinting process. In other words, the element portion 25p is disposed at a position corresponding to the fine pattern 15p of the template 10.

The configuration of the wafer 20 illustrated in FIG. 2 is only an example, and may be changed along with the configuration of the template 10.

Configuration Example of Imprinting Apparatus

Figure 3A:
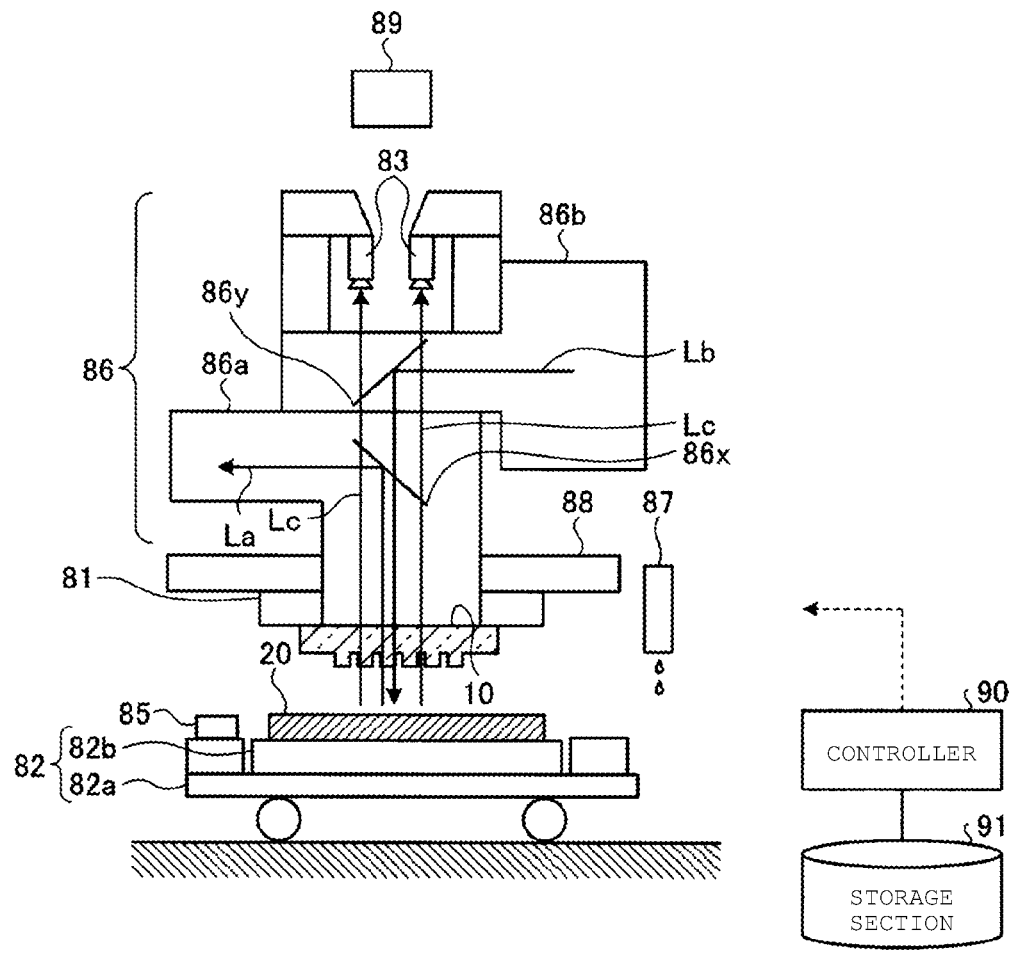
FIGS. 3A and 3B are diagrams illustrating a configuration example of an imprinting apparatus according to Embodiment 1.
Figure 3B:
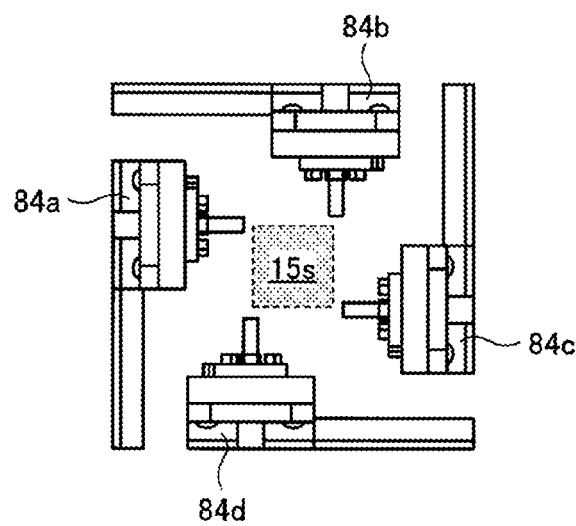

FIGS. 3A and 3B are diagrams illustrating a configuration example of an imprinting apparatus 1 according to Embodiment 1. FIG. 3A is a diagram illustrating the overall imprinting apparatus 1, and FIG. 3B illustrates a detailed configuration of imaging elements 84a to 84d provided in the imprinting apparatus 1, including an enlarged view of a detection system 86a.

As illustrated in FIGS. 3A and 3B, the imprinting apparatus 1 includes a template stage 81, a wafer stage 82, imaging elements 83 and 84a to 84d, a reference mark 85, an alignment section 86, a liquid dropping device 87, a stage base 88, a light source 89, a controller 90, and a storage section 91. The imprinting apparatus 1 is installed with the template 10 that transfers a fine pattern onto a resist on the wafer 20. The "imaging element" used hereinafter may be also referred to as "imager" or "image sensor."

The wafer stage 82 includes a wafer chuck 82b and a main body 82a. The wafer chuck 82b fixes the wafer 20 at a predetermined position on the main body 82a. The reference mark 85 is provided on the wafer stage 82. The reference mark 85 is used for alignment when the wafer 20 is loaded onto the wafer stage 82.

The wafer stage 82 is mounted with the wafer 20, and is moved in a plane (for example, a horizontal plane) parallel to the mounted wafer 20. The wafer stage 82 moves the wafer 20 to a lower side of the liquid dropping device 87 when a resist is dropped onto the wafer 20, and moves the wafer 20 to a lower side of the template 10 when a transfer process is performed on the wafer 20.

The stage base 88 supports the template 10 at the template stage 81, and is moved in an upward-downward direction (that is, a vertical direction) to press a fine pattern of the template 10 against a resist on the wafer 20.

The alignment section 86 including a plurality of imaging elements 83 is provided over the stage base 88. The alignment section 86 detects a location of the wafer 20 or a location of the template 10 on the basis of the alignment marks 11m to 13m and 21m to 23m provided on the template 10 and the wafer 20.

The alignment section 86 includes the detection system 86a and a lighting system 88b. The lighting system 86b exposes the template 10 and the wafer 20 to light, such that the alignment marks 11m to 13m and 21m to 23m formed thereof can be visually recognized. The detection system 88a detects images of the alignment marks 11m to 13m and 21m to 23m, and aligns the images with each other so as to perform alignment between the template 10 and the wafer 20.

The detection system 86a and the lighting system 88b respectively include mirrors 86x and 86y such as dichroic mirrors as image formation portions. The mirrors 86x and 86y form images of the alignment marks 11m to 13m and 21m to 23m from the template 10 and the wafer 20 by using light from the lighting system 88b. Specifically, light Lb from the lighting system 86b is reflected to the lower side where the wafer 20 and the like are disposed, by the mirror 86y. Light La from the wafer 20 or the like is reflected toward the detection system 86a side by the mirror 86x. Some light Lc from the wafer 20 or the like is transmitted through the mirrors 86x and 86y, and advances toward the sides of the imaging elements 83 located above.

As illustrated in FIG. 3B, the detection system 86a includes the plurality of imaging elements 84a to 84d. The image element described here and in the following description may be referred to as an image sensor. The light La from the template 10 and the wafer 20 is imaged as images including the alignment marks 11m to 13m and 21m to 23m by the imaging elements 84a to 84d. Here, the imaging elements 84a to 84d are respectively distributed to the alignment marks 11m to 13m and 21m to 23m.

In other words, for example, a position and an angle of view of the imaging element 84a are adjusted such that the alignment marks 11m and 21m can be imaged, and the imaging element 84a is configured to image only the alignment marks 11m and 21m. A position and an angle of view of the imaging element 84c are adjusted such that a set including the alignment marks 12m and 22m can be imaged, and the imaging element 84c is configured to image only the alignment marks 12m and 22m.

A position and an angle of view of the imaging element 84b are adjusted such that a set including the alignment marks 13m and 23m can be imaged. A position and an angle of view of the imaging element 84d are adjusted such that the alignment marks 13m and 23m that are diagonally disposed with respect to the imaging targets of the imaging element 84b can be imaged. As mentioned above, the imaging elements 84b and 84d are configured to image only the alignment marks 13m and 23m.

As illustrated in FIG. 3A, some light Lc from the template 10 and the wafer 20 is imaged as images including the alignment marks 11m to 13m by the imaging elements 83. Here, the imaging elements 83 are configured to image, for example, all of the alignment marks 11m to 13m to detect respective states of the alignment marks 11m to 13m. As will be described below, alignment is performed by using the alignment marks 11m to 13m and 21m to 23m from any one of the imaging elements 84a to 84d according to the states of the alignment marks 11m to 13m detected by the imaging elements 83. Details of the alignment process will be described below.

The liquid dropping device 87, which may be referred to as a liquid dispenser, is a device that drops a resist onto the wafer 20 according to an ink jet method. An ink jet head of the liquid dropping device 87 has a plurality of fine holes ejecting liquid droplets of the resist, and drops the liquid droplets of the resist onto the wafer 20.

The imprinting apparatus 1 of the Embodiment 1 is configured to drop the resist, but may coat the entire surface of the wafer 20 with the resist according to a spin coating method.

The light source 89 as a transfer section is, for example, a device that applies ultraviolet light, and is provided over the stage base 88. The light source 89 irradiates the template 10 with light in a state in which the template 10 is pressed against the resist.

The controller 90 controls the template stage 81, the wafer stage 82, the reference mark 85, the alignment section 86 including the imaging elements 83 and 84a to 84d, the liquid dropping device 87, the stage base 88, and the light source 89.

The storage section 91 stores various pieces of information or programs required for an operation of the imprinting apparatus 1. The storage section 91 stores alignment information such as a relative position between the template 10 and the wafer 20.

Semiconductor Device Manufacturing Method

Next, with reference to FIGS. 4A to 4E, a description will be made of an example of a semiconductor device manufacturing method including an imprinting process using the imprinting apparatus 1 of Embodiment 1. FIGS. 4A to 4E illustrate a flow of the semiconductor device manufacturing method according to Embodiment 1.

Figure 4A:
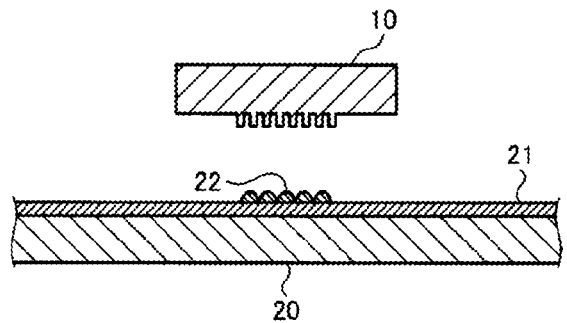
FIGS. 4A to 4E illustrate a flow of an example of a semiconductor device manufacturing method according to Embodiment 1.

As illustrated in FIG. 4A, the treatment film 21 is formed on the wafer 20 as a semiconductor substrate, and the resist 22 is dropped onto the treatment film 21.

Specifically, the wafer 20 provided with the treatment film 21 is mounted on the wafer stage 82. The wafer stage 82 is moved to the lower side of the liquid dropping device 87, and liquid droplets of the resist 22 are dropped onto the treatment film 21 from the liquid dropping device 87.

As described above, the entire surface of the wafer 20 may be coated with the resist 22 according to the spin coating method.

Thereafter, the wafer stage 82 is moved to the lower side of the template 10.

Figure 4B:
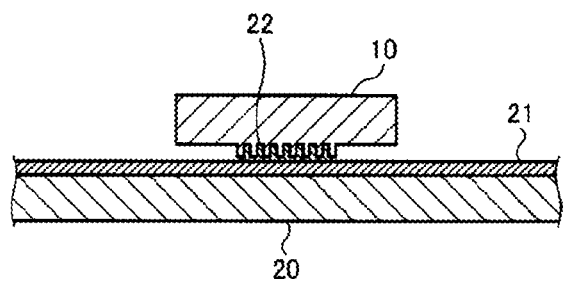

Next, as illustrated in FIG. 4B, the template stage 81 is moved downward, and a fine pattern of the template 10 is pressed against the resist 22 while the alignment section 86 is performing alignment.

Here, the alignment performed by the alignment section 86 is performed in two steps such as rough alignment and accurate alignment. Rough alignment marks used for the rough alignment and the alignment marks 11m to 13m and 21m to 23m used for the accurate alignment are formed in advance on the template 10 and the wafer 20. The rough alignment is performed in a nondestructive manner at a high speed by adjusting positions of the rough alignment marks of the template 10 and the wafer 20 before the template 10 and the wafer 20 are brought into contact with each other. However, since a distance between the rough alignment marks is long, positional accuracy is low. The accurate alignment is performed by using the alignment marks 11m to 13m and 21m to 23m of the template 10 and the wafer 20 in a state in which the template 10 and the wafer 20 are close to each other.

In the accurate alignment using the alignment marks 11m to 13m and 21m to 23m, the controller 90 detects respective states of the alignment marks 11m to 13m from the imaging elements 83 imaging all of the alignment marks 11m to 13m. The controller 90 performs alignment by using a combination of the predetermined alignment marks 11m to 13m and 21m to 23m while switching the imaging elements 84a to 84d to each other as appropriate according to the respective states of the alignment marks 11m to 13m. Details of the accurate alignment will be described below.

Next, in a state in which the template 10 is pressed, the resist 22 is irradiated with light from the light source 89 of the imprinting apparatus 1 such that the resist 22 is cured. Consequently, the fine pattern of the template 10 is transferred onto the resist 22.

Figure 4C:
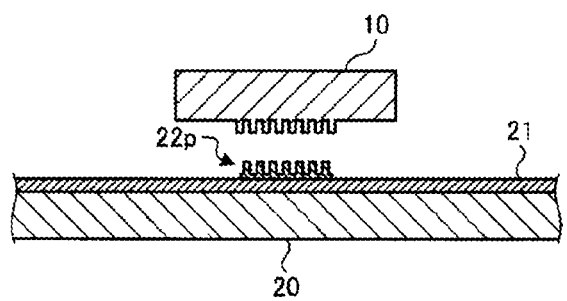

Next, as illustrated in FIG. 4C, the template 10 is peeled off. Consequently, a resist pattern 22p to which the fine pattern is transferred is formed on the treatment film 21 of the wafer 20.

Figure 4D:
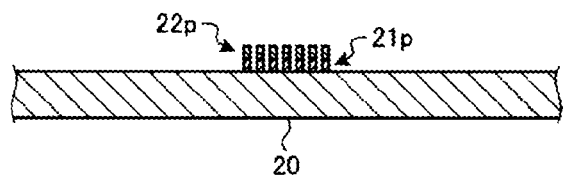

Next, as illustrated in FIG. 4D, the treatment film 21 is treated by using the resist pattern 22p to which the fine pattern is transferred as a mask. Consequently, a treatment film pattern 21p is formed.

Figure 4E:
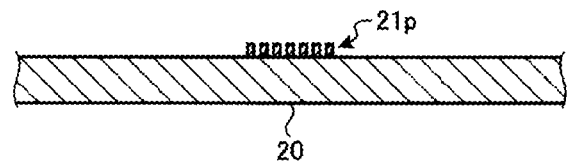

Next, as illustrated in FIG. 4E, the resist pattern 22p is peeled off through asking or the like, to obtain the treatment film pattern 21p formed on the wafer 20.

Subsequently, the steps are repeatedly executed, and a plurality of treatment film patterns are formed on the wafer 20 such that a semiconductor device is manufactured.

Specific Example of Alignment Process

Figure 5A:
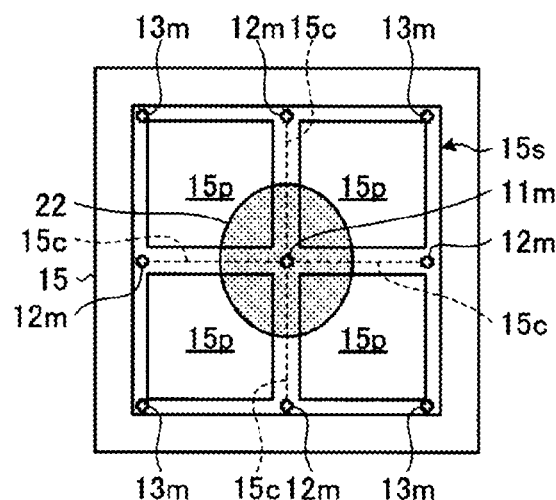
FIGS. 5A to 5C illustrate schematic plan views of a template to illustrate an alignment process between the template and the wafer according to Embodiment 1.
Figure 5B:
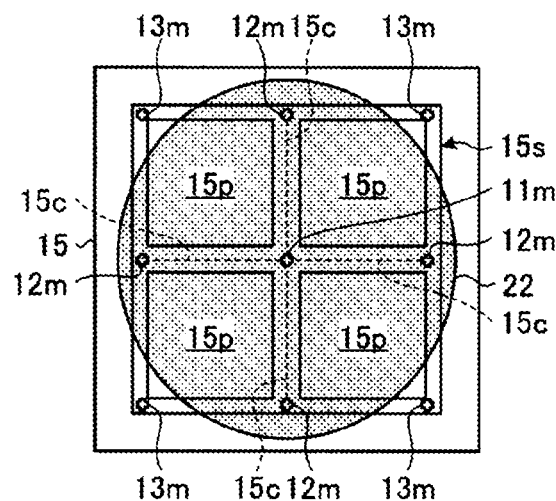
Figure 5C:
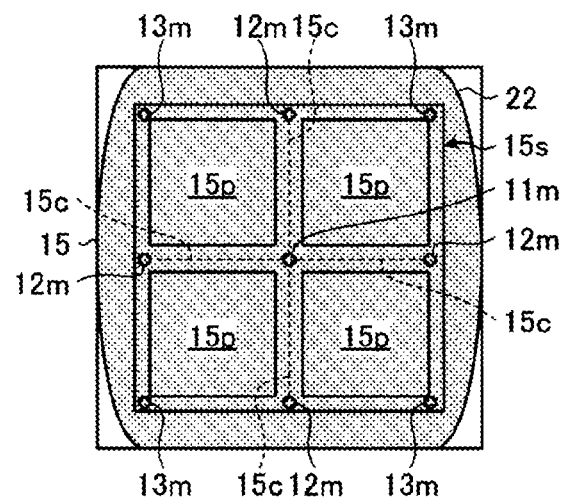

Next, with reference to FIGS. 5A to 5C, an alignment process between the template 10 and the wafer 20 of Embodiment 1 will be described in detail. FIGS. 5A to 5C illustrate schematic plan views of the template 10 to illustrate an alignment process between the template 10 and the wafer 20 according to Embodiment 1.

As described above, the accurate alignment between the template 10 and the wafer 20 is performed in a state in which the template 10 and the wafer 20 are close to each other. In this case, the template 10 is pressed against the resist 22 on the wafer 20. In this case, the template 10 is slightly warped to protrude toward the wafer 20 side such that a gas such as air in the resist 22 is removed, and the resist 22 is pressed and expanded from the vicinity of the center.

Consequently, the resist 22 disposed on the wafer 20 around the center of the shot region 15s of the template 10 extends and spreads outward of the shot region 15s in a surface direction of the template 10. The resist 22 fills recess portions of the fine patterns 15p of the template 10 and recess portions of the alignment marks 11m to 13m due to the capillary phenomenon.

The alignment between the template 10 and the wafer 20 is performed by sequentially using the alignment marks 11m to 13m filled with the resist 22 in the above-described way. The visibility of the alignment marks 11m to 13m, that is, contrast due to the uneven portions of the alignment marks 11m to 13m is increased in a state of being filled with the resist 22, and as a result alignment accuracy can be improved. Whether or not each of the alignment marks 11m to 13m is filled with the resist 22 is determined by the controller 90 by using images obtained by the imaging elements 83 imaging all of the alignment marks 11m to 13m.

As illustrated in FIG. 5A, the alignment mark 11m located around the center of the shot region 15s is filled with the resist 22 when a predetermined time elapses after the template 10 is pressed against the resist 22. When the scene is imaged by the imaging elements 83, an alignment operation between the template 10 and the wafer 20 is started by using the alignment mark 11m of the template 10 and the alignment mark 21m of the wafer 20.

Specifically, the wafer stage 82 mounted with the wafer 20 is moved in the horizontal plane such that the alignment marks 11m and 21m overlap each other while observing the alignment marks 11m and 21m with the imaging element 84a for the alignment marks 11m and 21m among the imaging elements 84a to 84d of the alignment section 86. However, such an alignment operation is relative, a position of the template 10 may be moved by any mechanism, and positions of both of the template 10 and the wafer 20 may be moved.

As illustrated in FIG. 5B, when a predetermined time further elapses after starting of the alignment operation using the alignment marks 11m and 21m, the alignment marks 12m located outside the alignment mark 11m are filled with the resist 22. When the scene is observed by the imaging elements 83, the alignment operation using the alignment marks 11m and 21m is stopped, and an alignment operation using the alignment marks 12m and 22m is started.

In this case, the alignment operation using the alignment marks 11m and 21m may not be completed. The completion of the alignment operation indicates, for example, a state in which deviation between the alignment marks 11m and 21m is within a predetermined range. Information regarding a relative position between the template 10 and the wafer 20 at the time of stopping of the alignment operation using the alignment marks 11m and 21m is stored into the storage section 91 of the imprinting apparatus 1, and the alignment operation using the alignment marks 12m and 22m is started on the basis thereof.

In the alignment operation using the alignment marks 12m and 22m, a relative position between the template 10 and the wafer 20 is adjusted such that the alignment marks 12m and 22m overlap each other while observing the alignment marks 12m and 22m with the imaging element 84c for the alignment marks 12m and 22m among the imaging elements 84a to 84d of the alignment section 86.

Here, the alignment marks 12m and 22m are located outside the alignment marks 11m and 21m. A positional deviation such as a rotational deviation is easily detected by using the alignment marks 12m and 22m located further outside. In other words, alignment accuracy using the alignment marks 12m and 22m is higher than alignment accuracy using the alignment marks 11m and 21m. For that reason, even though the alignment operation using the alignment marks 11m and 21m is completed when the alignment operation using the alignment marks 11m and 21m is stopped, the deviation between the alignment marks 12m and 22m may not be within the predetermined range. In this example, the alignment operation using the alignment marks 12m and 22m is also performed supposing such a case.

As illustrated in FIG. 5C, when a predetermined time further elapses after starting of the alignment operation using the alignment marks 12m and 22m, the alignment marks 13m located outside the alignment marks 12m are filled with the resist 22. When the scene is observed by the imaging elements 83, the alignment operation using the alignment marks 12m and 22m is stopped, and an alignment operation using the alignment marks 13m and 23m is started.

In this case, the alignment operation using the alignment marks 12m and 22m may not be completed. Information regarding a relative position between the template 10 and the wafer 20 at the time of stopping of the alignment operation using the alignment marks 12m and 22m is stored into the storage section 91 of the imprinting apparatus 1, and the alignment operation using the alignment marks 13m and 23m is started on the basis thereof.

In the alignment operation using the alignment marks 13m and 23m, a relative position between the template 10 and the wafer 20 is adjusted such that the alignment marks 13m and 23m overlap each other while observing the alignment marks 13m and 23m with the imaging elements 84b and 84d for the alignment marks 13m and 23m.

Here, even though the alignment operation using the alignment marks 12m and 22m is completed, deviation between the alignment marks 13m and 23m with higher alignment accuracy may not be within a predetermined range.

In the alignment marks 13m and 23m that are located on the outermost sides in the shot region 15s and have the highest alignment accuracy, the alignment operation is continued until the deviation between the alignment marks 13m and 23m enters a predetermined range and the alignment operation is completed.

Through the above-described operations, the accurate alignment between the template 10 and the wafer 20 is finished.

When a defect occurs in alignment using the alignment marks 12m and 22m after transition to the alignment using the alignment marks 12m and 22m, alignment may be performed again by using the alignment marks 11m and 21m. This is a case where a filling deficiency not observed by the imaging elements 83 occurs in the alignment mark 12m, or sufficient contrast cannot be obtained due to surrounding environments. Similarly, alignment may be performed again by using the alignment marks 12m and 22m or the alignment marks 11m and 21m after transition to the alignment using the alignment marks 13m and 23m.

COMPARATIVE EXAMPLE

Next, with reference to FIGS. 6A and 6B, an alignment process of a comparative example will be described. In the alignment process of the comparative example, the alignment process is performed by using only either an alignment mark located around an outer edge of a shot region or an alignment mark located inside the shot region. An imprinting apparatus of the comparative example does not include a configuration corresponding to the imaging elements 83 imaging all alignment marks, and an imaging element used for alignment images only the alignment mark.

Figure 6A:
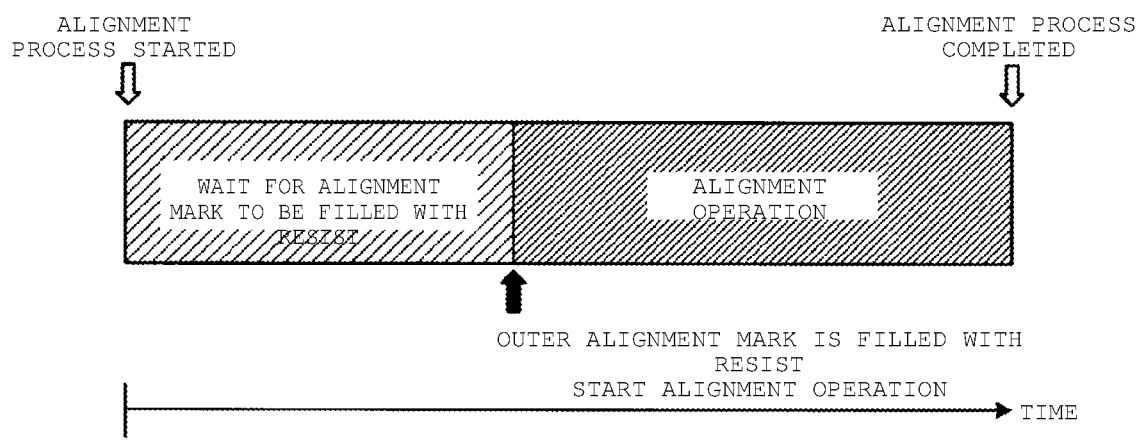
FIGS. 6A and 6B are diagrams illustrating examples of timelines for an alignment process according to Embodiment 1 and an alignment process according to a comparative example.

FIG. 6A is a diagram illustrating an example of a timeline for an alignment process using an outer alignment mark located around an outer edge of a shot region. Herein, the alignment process is assumed to be started from the time at which a template is pressed against a resist. However, an alignment operation of moving a wafer stage is not immediately started. There is a predetermined time from starting of the alignment process, that is, the time to wait for the outer alignment mark to be filled with the resist. In the comparative example, the waiting time from starting of the alignment process is assumed to be acquired in advance. The outer alignment mark is filled with the resist when the time elapses, then the alignment operation is started, and the alignment process is finished when a necessary predetermined time elapses.

In this case, the time to wait the alignment mark to be filled with the resist delays starting of the alignment operation, and thus reduces a throughput of the alignment process. However, when alignment is started in a state in which the alignment mark is insufficiently filled with the resist, the visibility of the alignment mark degrades, and alignment accuracy deteriorates.

Here, when an alignment mark is disposed further inside the shot region, arrival and filling of the alignment mark with the resist are quickened, and thus the time to wait the alignment mark to be filled with the resist can be reduced. However, the alignment mark disposed on the inside is lower in alignment accuracy than the alignment mark disposed on the outside, particularly, lower in rotational deviation.

Figure 6B:
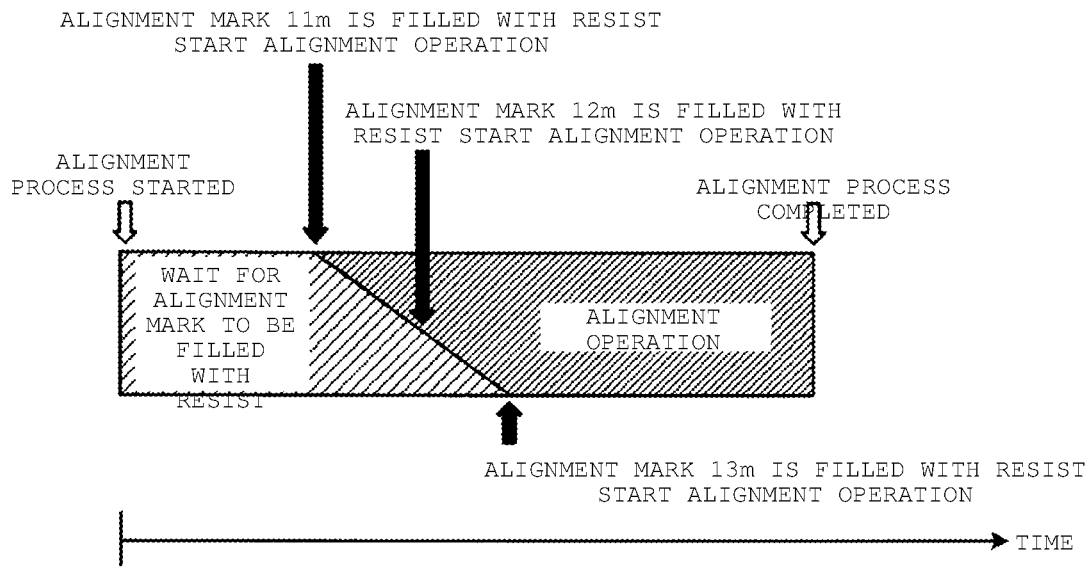

FIG. 6B is a diagram illustrating an example of a timeline for an alignment process of Embodiment 1. In the same manner as in FIG. 6A, herein, an alignment process is assumed to be started from the time at which the template is pressed against the resist 22. However, in the alignment process of Embodiment 1, first, the alignment marks 11m and 21m disposed around the center of the shot region 15s are used for alignment, and thus an alignment operation can be started earlier than in the comparative example.

Thereafter, an alignment operation using the alignment marks 12m and 22m and an alignment operation using the alignment marks 13m and 23m are started in an order of being filled with the resist 22. In this case, in the examples illustrated in FIGS. 6A and 6B, a time point at which the alignment operation using the alignment marks 13m and 23m is started substantially matches a time point at which the alignment operation using the outer alignment mark is started in the comparative example.

However, when the alignment operation using the alignment marks 13m and 23m is started, a deviation amount of a relative position between the template 10 and the wafer is smaller through the previous alignment operations using the alignment marks 11m, 12m, 21m, and 22m than in the comparative example. Thus, the alignment operation using the alignment marks 13m and 23m can be completed in a relatively short period of time. Therefore, the time for the whole alignment process including the filling waiting time of the resist 22 can be reduced.

As mentioned above, according to the alignment process of Embodiment 1, the alignment operation is started by using a part of the filling waiting time of the resist 22. Consequently, it is possible to improve a throughput of the alignment process.

According to the alignment process of Embodiment 1, the alignment operation is completed by using the alignment marks 13m and 23m located on the outermost side. Consequently, it is possible to maintain high alignment accuracy.

According to the alignment process of Embodiment 1, starting time points of alignment operations using the respective alignment marks 11m to 13m and 21m to 23m are determined while observing states of all of the alignment marks 11m to 13m with the imaging elements 83. Consequently, for example, it is possible to determine a starting time point of an alignment operation in accordance with an actual status with higher accuracy than in a case of determining a starting time point of alignment operation on the basis of a time acquired in advance as in the comparative example.

According to the alignment process of Embodiment 1, at least one of the imaging elements 84a to 84d corresponds to each of the alignment marks 11m to 13m and 21m to 23m. Consequently, it is possible to more quickly cope with changing of the alignment marks 11m to 13m and 21m to 23m that are in use than in a case where target alignment marks are imaged while moving a single imaging element. As mentioned above, it is possible not only to reduce a movement time but also to reduce a variation in a position due to movement or a variation in focus adjustment.

In the Embodiment 1, the imaging element 84b imaging one set among a plurality of sets of alignment marks 12m and 22m and the imaging element 84d imaging two sets among a plurality of sets of alignment marks 13m and 23m are provided, but this is only an example. A single imaging element is more preferably allocated to a set including alignment marks. In other words, in the example of Embodiment 1, nine imaging elements are preferably provided in the imprinting apparatus.

When imaging elements corresponding to all of the alignment marks 11m to 13m and 21m to 23m are provided, it is possible not only to perform an alignment operation by performing switching from the alignment marks 12m and 22m to the alignment marks 13m and 23m after all of the alignment marks 13m are filled with the resist 22 but also to start an alignment operation by performing switching from the alignment mark 13m filled with the resist 22 earlier among the plurality of alignment marks 13m.

Regardless of the example of Embodiment 1, switching among the alignment marks 11m to 13m and 21m to 23m may be performed after an alignment operation using each of the alignment marks 11m to 13m and 21m to 23m is completed. In this case, when imaging elements corresponding to the number of sets of the alignment marks 11m to 13m and 21m to 23m are provided, it is possible not only to perform switching to the alignment marks 13m and 23m after alignment using all of the alignment marks 12m and 22m is completed but also to start an alignment operation by performing switching from a set including the alignment marks 12m and 22m by using which alignment is completed among a plurality of sets of the alignment marks 12m and 22m to the alignment marks 13m and 23m.

Embodiment 2

Hereinafter, with reference to the drawings, Embodiment 2 will be described in detail. An alignment process of Embodiment 2 is different from that of Embodiment 1 in that the alignment marks 11m to 13m and 21m to 23m to be used for an alignment operation are switched to each other on the basis of a change in a signal for contrast of the alignment marks 11m to 13m.

The alignment process of Embodiment 2 is performed while, for example, all of the alignment marks 11m to 13m are observed with a plurality of imaging elements from the beginning of an alignment operation. In other words, an imprinting apparatus of Embodiment 2 includes, for example, imaging elements for alignment of the number respectively corresponding to all of the alignment marks 11m to 13m. A controller of the imprinting apparatus of Embodiment 2 sequentially switches the alignment marks 11m to 13m and 21m to 23m to be used for an alignment operation on the basis of detection signals for the alignment marks 11m to 13m from the imaging elements.

Figure 7A:
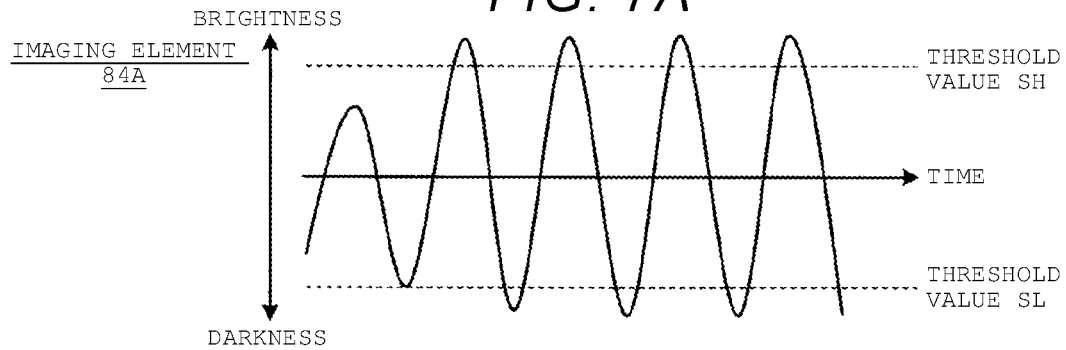
FIGS. 7A to 7C are schematic graphs illustrating examples of detection signals from imaging elements provided in an imprinting apparatus according to Embodiment 2.
Figure 7B:
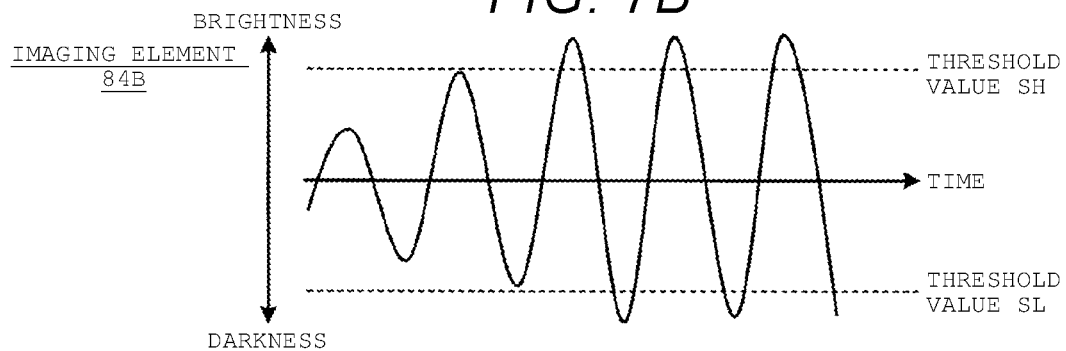
Figure 7C:
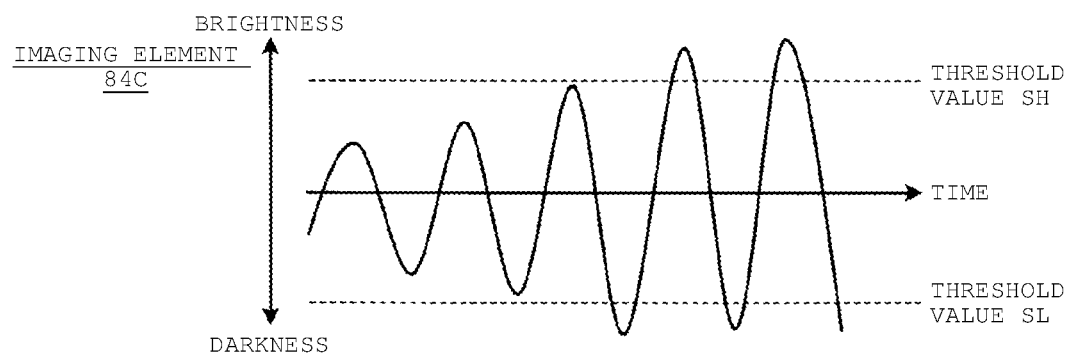

FIGS. 7A to 7C are schematic diagrams illustrating examples of detection signals from imaging elements 84A to 84C provided in the imprinting apparatus of Embodiment 2.

The imaging element 84A illustrated in FIG. 7A is, for example, an imaging element imaging the alignment mark 11m. The imaging element 84A detects contrast caused by brightness and darkness indicated by detection light from the alignment mark 11m as a detection signal, and transmits the detection signal to the controller.

The controller determines whether or not respective peaks of the brightness and the darkness reach predetermined threshold values SH and SL. The threshold values SH and SL are set on the basis of peaks of brightness and darkness obtained when each of the alignment marks 11m to 13m is sufficiently filled with the resist 22. When the respective peaks of the brightness and the darkness are equal to or more than the threshold values SH and SL, the controller starts an alignment operation using the alignment marks 11m and 21m.

The detection signal from the alignment mark 11m indicates peaks of brightness and darkness less than the threshold values SH and SL at the beginning when the template 10 is pressed against the resist 22. This is because filling with the resist 22 is insufficient. However, the threshold values SH and SL are reached in a relatively short period of time therefrom, and it can be seen that the filling with the resist 22 is sufficient. Then, an alignment operation using the alignment marks 11m and 21m is started.

The imaging element 84B illustrated in FIG. 7B is, for example, an imaging element imaging any one of a plurality of alignment marks 12m. The imaging element 84B detects contrast caused by brightness and darkness indicated by detection light from the alignment mark 12m as a detection signal, and transmits the detection signal to the controller.

The controller determines whether or not respective peaks of the brightness and the darkness reach the predetermined threshold values SH and SL. When the respective peaks of the brightness and the darkness are equal to or more than the threshold values SH and SL, the controller starts an alignment operation using the alignment marks 12m and 22m.

The detection signal from the alignment mark 12m reaches the threshold values SH and SL later than the detection signal from the alignment mark 11m after the template 10 is pressed against the resist 22. Then, an alignment operation using the alignment marks 12m and 22m is started.

The imaging element 84C illustrated in FIG. 7C is, for example, an imaging element imaging any one of a plurality of alignment marks 13m. The imaging element 84C detects contrast caused by brightness and darkness indicated by detection light from the alignment mark 13m as a detection signal, and transmits the detection signal to the controller.

The controller determines whether or not respective peaks of the brightness and the darkness reach the predetermined threshold values SH and SL. When the respective peaks of the brightness and the darkness are equal to or more than the threshold values SH and SL, the controller starts an alignment operation using the alignment marks 13m and 23m.

The detection signal from the alignment mark 13m reaches the threshold values SH and SL later than the detection signal from the alignment mark 12m after the template 10 is pressed against the resist 22. Then, an alignment operation using the alignment marks 13m and 23m is started.

According to the alignment process of Embodiment 2, the alignment marks 11m to 13m and 21m to 23m to be used for an alignment operation are switched to each other on the basis of a change in contrast of detection light from the alignment marks 11m to 13m. Consequently, each alignment operation can be started in a state in which the alignment marks 11m to 13m are more relatively filled with the resist 22. Each alignment operation can be started at a more appropriate time point.

Other Embodiments

In Embodiments 1 and 2, the alignment process is performed by using three types of alignment marks 11m to 13m having different distances from the central position of the shot region 15s in the shot region 15s. However, the types of alignment marks may be at least two types of alignment marks such as an alignment mark disposed on the inside and an alignment mark disposed on the outside. Four or more types of alignment marks having different from distances from a central position of a shot region may be used.

In Embodiments 1 and 2, each alignment operation is performed by using three types of combinations such as a combination of the alignment mark 11m substantially located at the central position of the shot region 15s, a combination of a plurality of alignment marks 12m having the same distance from the central position, and a combination of a plurality of alignment marks 13m having the same distance from the central position. This is because the time required for the alignment marks having the same distance from the central position to be filled with the resist 22 is also regarded to be the same.

Figure 8A:
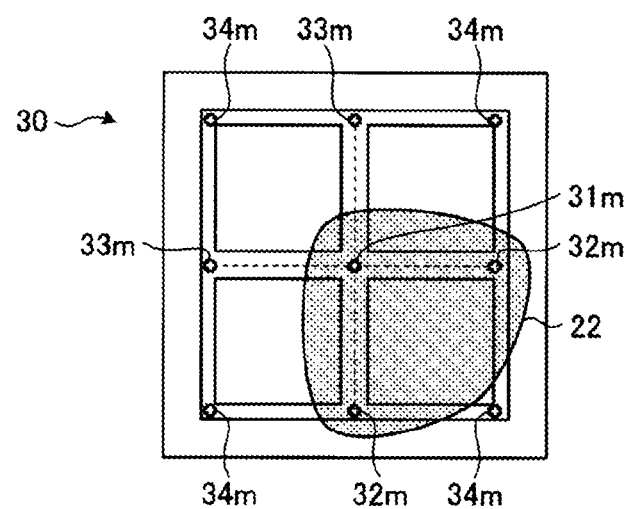
FIGS. 8A to 8C illustrate schematic plan views of a template to illustrate an alignment process between the template and the wafer according to other embodiments.
Figure 8B:
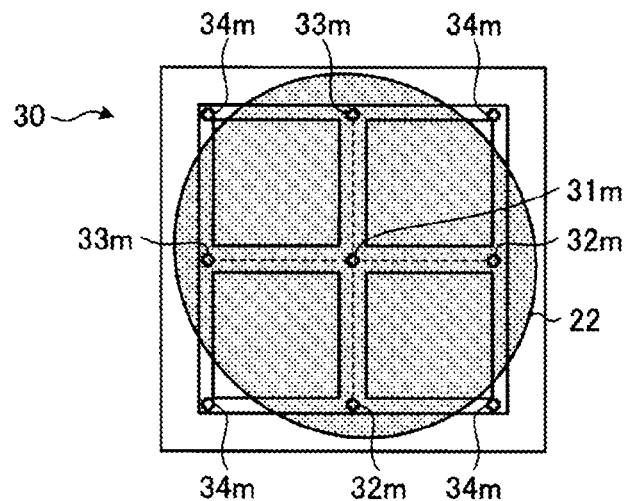
Figure 8C:
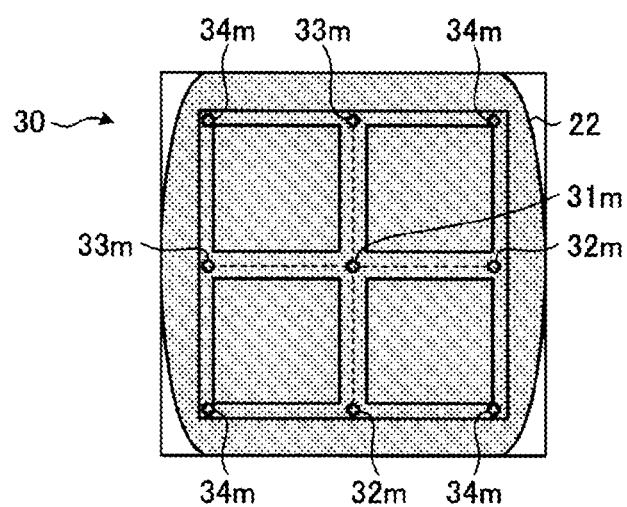

However, even though alignment marks have the same distance from the central position, the time required for the alignment marks to be filled with the resist 22 may differ depending on a configuration of a fine pattern of a template or disposition of a pattern region. For example, as illustrated in FIGS. 8A to 8C, this case is a case of using a template 30 causing the resist 22 to have characteristics of preferentially extending and spreading in a predetermined direction. In this case, an alignment operation may be performed by using alignment marks for which the time required to be filled with the resist 22 is the same as a set.

In the examples illustrated in FIGS. 8A to 8C, the resist 22 extends and spreads to be biased from a central position of a shot region. For that reason, despite an alignment mark 32m and an alignment mark 33m having the same distance from the center, the alignment mark 32m is filled with the resist 22 earlier than the alignment mark 33m.

For example, an alignment operation may be performed by using a single alignment mark 31m, then, an alignment operation may be performed by using a set including a plurality of alignment marks 32m (for example, FIG. 8A), next, an alignment operation may be performed by using a set including a plurality of alignment marks 33m (for example, FIG. 8B), and, finally, an alignment operation may be performed by using a set including a plurality of alignment marks 34m (for example, FIG. 8C).

In Embodiments 1 and 2, the alignment marks 11m to 13m and 21m to 23m to be used for an alignment operation are switched to each other on the basis of observation using the imaging elements 83 or signals for contrast acquired by the imaging elements 84A to 84C, but this is only an example. The time required for the alignment marks 11m to 13m to be filled with the resist 22 may be acquired in advance, and the alignment marks 11m to 13m and 21m to 23m may be switched to each other on the basis thereof.

In the Embodiments 1 and 2, a region is divided into the shot regions 15s, and a plurality of imprinting processes are performed on the wafer 20, but the alignment process may also be applied to a case where an imprinting process is collectively performed on the entire wafer surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprinting apparatus comprising:
a template stage configured to hold a template;
a substrate stage configured to hold a substrate;
a stage base to which the template stage is fixed;
a liquid dispenser;
a first image sensor positioned to detect a first alignment mark included in the template and generate a first detection signal of the first alignment mark;
a second image sensor positioned to detect a second alignment mark included in the template and generate a second detection signal of the second alignment mark; and
a controller configured to:
control the liquid dispenser to apply non-solidified resin onto a surface of the substrate held by the substrate stage;
control the stage base to move toward the substrate stage, such that the template held by the template stage is placed onto the non-solidified resin applied onto the surface of a substrate, such that the non-solidified resin extends into a pattern of the template in a surface direction of the substrate, the substrate including a third alignment mark and a fourth alignment mark;
detect a first timing when the non-solidified resin has extended into the first alignment mark and not yet into the second alignment mark, based on a peak of the first detection signal having reached a brightness threshold and a bottom of the first detection signal having reached a darkness threshold, and a peak of the second detection signal having not reached the brightness threshold or a bottom of the second detection signal having not reached the darkness threshold;
upon detection of the first timing, start a first alignment operation to align the template with the substrate such that the first and third alignment marks fall within a first predetermined deviation;
detect a second timing when the non-solidified resin has extended into the first and second alignment marks, based on the peak of the first detection signal having reached the brightness threshold and the bottom of the first detection signal having reached the darkness threshold, and the peak of the second detection signal having reached the brightness threshold and the bottom of the second detection signal having reached the darkness threshold, the second timing being after the first timing; and upon detection of the second timing, terminate the first alignment operation and start a second alignment operation to align the template with the substrate such that the second and fourth alignment marks fall within a second predetermined deviation.

2. The imprinting apparatus according to claim 1, wherein the second alignment mark is not used for alignment during the first alignment operation, and the first alignment mark is not used for alignment during the second alignment operation.

3. The imprinting apparatus according to claim 1, further comprising:

a third image sensor positioned to detect a fifth alignment mark included in the template and generate a third detection signal of the fifth alignment mark, wherein the substrate includes a sixth alignment mark, and the non-solidified resin has not yet extended into the third alignment mark at the first timing and the second timing, and the controller is further configured to:

detect a third timing when the non-solidified resin has extended into the first, second, and third alignment marks, based on the peak of the first detection signal having reached the brightness threshold and the bottom of the first detection signal having reached the darkness threshold, the peak of the second detection signal having reached the brightness threshold and the bottom of the second detection signal having reached the darkness threshold, and a peak of the third detection signal having reached the brightness threshold and a bottom of the third detection signal having reached the darkness threshold, the third timing being after the second timing; and upon detecting the third timing, terminate the second alignment operation and start a third alignment operation to align the template with the substrate such that the fifth and sixth alignment marks are within a third predetermined deviation.

4. The imprinting apparatus according to claim 3, wherein the controller is configured to continue the third alignment operation until the fifth and sixth alignment marks fall within the third predetermined deviation.

5. The imprinting apparatus according to claim 3, wherein a distance between the first alignment mark and the second alignment mark is less than a distance between the first alignment mark and the fifth alignment mark.

6. The imprinting apparatus according to claim 1, wherein the controller is configured to continue the second alignment operation until the second and fourth alignment marks fall within the second predetermined deviation.

* * * * *